United States Patent
Bathan et al.

(10) Patent No.: US 7,541,221 B2
(45) Date of Patent: Jun. 2, 2009

(54) INTEGRATED CIRCUIT PACKAGE SYSTEM WITH LEADFINGER SUPPORT

(75) Inventors: Henry D. Bathan, Singapore (SG); Zigmund Ramirez Camacho, Singapore (SG); Arnel Trasporto, Singapore (SG); Jeffrey D. Punzalan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 389 days.

(21) Appl. No.: 11/307,386

(22) Filed: Feb. 4, 2006

(65) Prior Publication Data

US 2007/0181982 A1    Aug. 9, 2007

(51) Int. Cl.
*H01L 21/44* (2006.01)
*H01L 21/48* (2006.01)
(52) U.S. Cl. .................. 438/123; 438/108; 257/666; 257/673; 257/E23.039
(58) Field of Classification Search ............. 438/123, 438/108; 257/673, 666
See application file for complete search history.

(56) References Cited

U.S. PATENT DOCUMENTS

| 5,099,306 | A | * | 3/1992 | Dunaway et al. | ............ 257/666 |
| 5,233,504 | A | | 8/1993 | Melton et al. | ............... 361/760 |
| 5,492,266 | A | * | 2/1996 | Hoebener et al. | ........ 228/248.1 |
| 6,214,642 | B1 | * | 4/2001 | Chen et al. | ................. 438/108 |
| 6,337,522 | B1 | * | 1/2002 | Kang et al. | ................. 257/784 |
| 6,376,921 | B1 | | 4/2002 | Yoneda et al. | ............. 257/787 |
| 6,482,680 | B1 | * | 11/2002 | Khor et al. | .................. 438/123 |
| 6,720,642 | B1 | | 4/2004 | Joshi et al. | ................... 257/637 |
| 6,835,580 | B1 | | 12/2004 | Knapp et al. | .................. 438/15 |
| 6,933,607 | B2 | | 8/2005 | Ono et al. | .................... 257/737 |
| 2006/0192295 | A1 | * | 8/2006 | Lee et al. | .................... 257/778 |

* cited by examiner

*Primary Examiner*—Nitin Parekh
(74) *Attorney, Agent, or Firm*—Mikio Ishimaru

(57) ABSTRACT

An integrated circuit package system including forming a leadframe having a lead with a leadfinger support of a predetermined height, and attaching an integrated circuit die with an electrical interconnect at a predetermined collapse height determined by the predetermined height of the leadfinger support.

8 Claims, 3 Drawing Sheets

INTEGRATED CIRCUIT PACKAGE SYSTEM WITH LEADFINGER SUPPORT

TECHNICAL FIELD

The present invention relates generally to package systems, and more particularly to a system for an integrated circuit package.

BACKGROUND ART

Protecting integrated circuits in ever decreasing packages has become increasingly difficult and costly. Integrated circuits or semiconductors usually are encapsulated in a package prior to installation into an electronic system. Device, die or chip packages perform several key functions such as, connecting integrated circuits to an electronic system at a next level of integration or hierarchy, physical protection from further handing and additional manufacturing processes, environmental protection including environments within multiple levels of electronic systems and heat dissipation from the integrated circuits and other components. These functions present chipmakers with a number of design and manufacturing challenges that must also be balanced with factors such as cost and pricing.

Flip-chip packaging is one type of electronic chip packaging technology, and has been in existence for many years. Flip-chip packaging has progressed to include a wide variety of materials and methods for bumping and attaching devices. Although the technology has progressed, challenges still exist in solving problems with manufacturing yield, device reliability, higher frequency applications, tighter space requirements, reduced costs, and general device performance. Many of the challenges to solving these continuing problems can be attributed to some key packaging issues including bump collapse level, bump spread distance and paddle damage such as paddle delamination.

A bump is placed onto the integrated circuit die contact, heated, and cooled to reflow the alloy to form a bump and to bond the bump to the integrated circuit die. The integrated circuit die is then assembled with the package so that the bump rests upon the corresponding package contact. The assembly is heated and cooled to bond the bump to the package. This attaches the integrated circuit die to the package and electrically connects the contacts for conducting electrical signals, with the integrated circuit die and the package spaced apart by the bump. During reflow, the bump tends to collapse under the weight of the integrated circuit die, creating a collapsed configuration that tends to concentrate stresses at the solder bonds and reduces the spacing thereby restricting access for encapsulation, cleaning or other post-connection operations.

Integrated circuit packages also provide electrical interconnection of integrated circuits to an electronic system at the next level of integration or hierarchy. A leadframe is one common means of electrical interconnection. The leadframe is formed from electrically conductive material, which is formed into leads. The lead ends are electrically connected to the integrated circuit die and the next level electronic system including external circuitry such as a printed circuit board. The leadframe also often include a die attach paddle to mount the integrated circuit die. The large surface area, exposed edges and narrow component spacing of the die attach paddle are often susceptible to manufacturing problems including damage during encapsulation of the integrated circuit package.

Integrated circuits are used in many portable electronic products, such as cell phones, portable computers, voice recorders, etc. as well as in many larger electronic systems, such as cars, planes, industrial control systems, etc. Across virtually all applications, there continues to be demand for reducing the size and increasing performance of the devices. The intense demand is no more visible than in portable electronics that have become so ubiquitous. As the demand for smaller electronic devices grows, manufacturers are seeking ways to reduce the size of the packaged integrated circuits. To meet these needs, packaging technologies are increasingly using smaller area designs with smaller features.

Thus, a need still remains for an integrated circuit package system to provide improved reliability and manufacturing yield with smaller features in smaller area. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides forming a leadframe having a lead with a leadfinger support of a predetermined height, and attaching an integrated circuit die with an electrical interconnect at a predetermined collapse height determined by the predetermined height of the leadfinger support.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
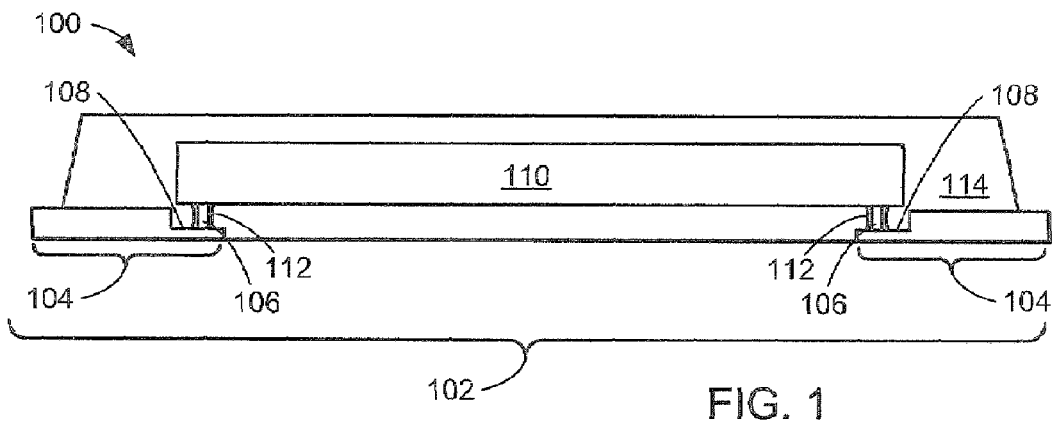
FIG. 1 is a cross-sectional view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the invention with surfaces as oriented downward, this arrangement in the FIGs. is arbitrary and is not intended to suggest that invention should necessarily be in a downward direction. Generally, the device can be operated in any orientation. In addition, the same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100 in an embodiment of the present invention. The integrated circuit package system 100 includes a leadframe 102 having leads 104 with a leadfinger support 106. The leadfinger support 106 may be formed by an etch process applied to the leads 104. The leadfinger support 106 may be formed as a protruding shape, such as a stud vertically protruding from the leads 104. The leads 104 may also include a wetting surface 108 around the leadfinger support 106.

The integrated circuit package system 100 also includes an integrated circuit die 110 having electrical interconnects 112, such as solder bumps. The electrical interconnects 112 may be formed on the integrated circuit die 110 and flowed on the leadfinger support 106 providing electrical connectivity between the integrated circuit die 110 and the leadframe 102.

The leadfinger support 106 provides control for a collapse level or height of the electrical interconnects 112 on the leads 104. The wetting surface 108, such as a recess in the leads 104, provides a physical resistance to the wetting or spread distance of the electrical interconnects 112. The control of the collapse level and the spread distance of the electrical interconnects 112 provide a substantially controlled position of the integrated circuit die 110 along both the horizontal plane and vertical axes. It has been discovered that the substantially controlled position of the integrated circuit die 110 provides for an optional die attach paddle (not shown). The substantially controlled position of the integrated circuit die 110 also provides reduced stress and improved spacing for post-connection operations such as encapsulation or cleaning.

The integrated circuit package system 100 may also include an encapsulant 114. The encapsulant 114 covers and protects the integrated circuit die 110 and the leadframe 102. An encapsulating process such as molding, bonding or sealing may be used to apply the encapsulant 114. The encapsulating process applies the encapsulant 114 over the integrated circuit die 110, the electrical interconnects 112, the leadframe 102, the leads 104, the leadfinger support 106 and the wetting surface 108. The encapsulant 114 may conform to the integrated circuit die 110 and the leadframe 102, although it is understood that the encapsulant may cover the integrated circuit die 110 and the leadframe 102 with other encapsulating processes.

Figure 2:
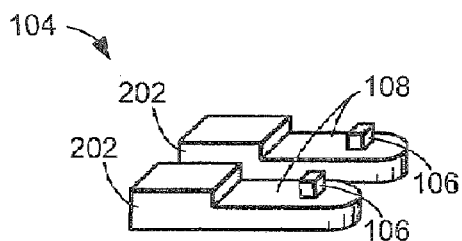
FIG. 2 is an isometric view of the leads having the leadfinger support.

Referring now to FIG. 2, therein is shown an isometric view of the leads 104 having the leadfinger support 106. The leads 104 also include the wetting surface 108 and external connections 202. The external connections 202 provide electrical connectivity to an electronic system (not shown) at a next level of integration or hierarchy such as a printed circuit board. An inner tip of the leads 104 may be etched to a reduced height while leaving portions protruding to form the leadfinger support 106. The reduced height of the inner tip of the leads 104 forms the wetting surface 108. It has been discovered that the leads 104 electrically connect the integrated circuit die 110 of FIG. 1 to the electronic system while providing control for the collapse level and the spread distance of the electrical interconnects 112.

The shape and size of the leadfinger support 106 and the wetting surface 108 of the leads 104 provide a predetermined extent for the collapse level and the spread distance. For illustrative purposes, the leadfinger support 106 is shown as a rectangular prism, although it is understood that other shapes, number of shapes or sizes may be used.

Figure 3:
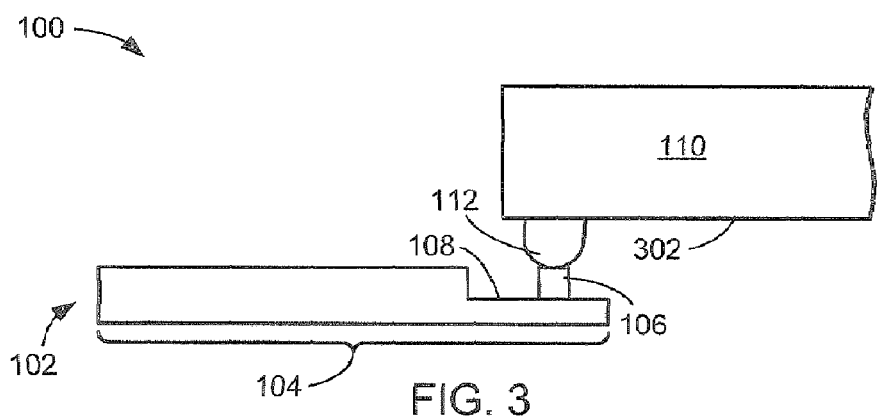
FIG. 3 is a cross-sectional view of the integrated circuit package system in a die placement phase.

Referring now to FIG. 3, therein is shown a cross-sectional view of the integrated circuit package system 100 in a die placement phase. The integrated circuit package system 100 includes the integrated circuit die 110 over the leadframe 102. The integrated circuit die 110 and the leadframe 102 are substantially fixed in a predetermined position. The electrical interconnects 112 are formed on an active surface 302 of the integrated circuit die 110. Each of the electrical interconnects 112 on the active surface 302 of the integrated circuit die 110 are substantially aligned to each of the leadfinger support 106 of the leadframe 102.

A fixture (not shown) may hold the integrated circuit die 110 and the leadframe 102 substantially aligned in the horizontal plane. A wetting interface material (not shown) may be applied between the electrical interconnects 112 and the leadfinger support 106. The wetting interface material may provide adhesion between the electrical interconnects 112 and the leadfinger support 106. The fixture may allow vertical movement of the integrated circuit die 110 or the leadframe 102, or the fixture may release the integrated circuit die 110 or the leadframe 102 for attachment.

Figure 4:
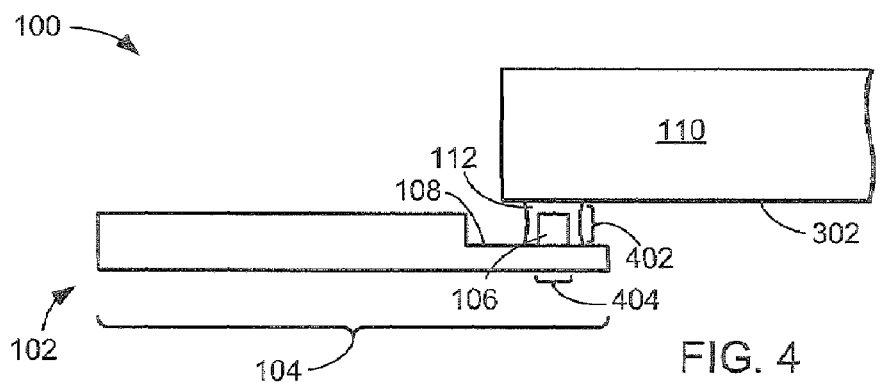
FIG. 4 is a cross-sectional view of the integrated circuit package system in a die attachment phase.

Referring now to FIG. 4, therein is shown a cross-sectional view of the integrated circuit package system 100 in a die attachment phase. The integrated circuit package system 100 includes the integrated circuit die 110 mounted over the leadframe 102. An attachment process, such as an attach reflow, provides flowing of the electrical interconnects 112 on the active surface 302 around the leadfinger support 106 of the leads 104. The attachment process may include a thermal or similar process providing a liquefying or partial liquefying of the electrical interconnects 112. The electrical interconnects 112 in a liquid or partial liquid state flows around the leadfinger support 106 and over the wetting surface 108 of the leads 104.

The flowing of the electrical interconnects 112 results in a collapse of the electrical interconnects 112 and a position of the integrated circuit die 110 at a collapse level 402 determined by the size and shape of the leadfinger support 106. The flowing of the electrical interconnects 112 also results in the wetting of the electrical interconnects 112 over the wetting surface 108 to a spread distance 404 determined by the size and shape of the wetting surface 108. Each of the electrical interconnects 112 may overlap one each of the leadfinger support 106 and the wetting surface 108 to an extent predetermined by the size and shape of the leadfinger support 106 and the wetting surface 108.

Figure 5:
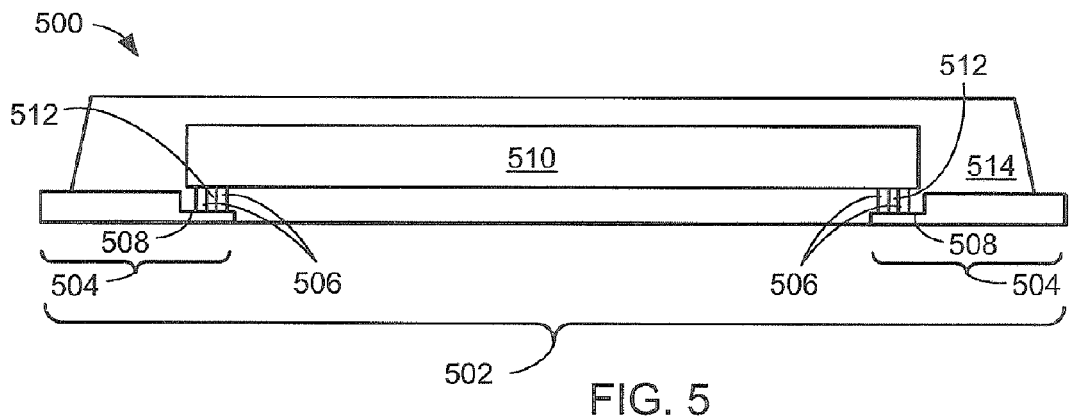
FIG. 5 is a cross-sectional view of an integrated circuit package system in an alternative embodiment of the present invention.

Referring now to FIG. 5, therein is shown a cross-sectional view of an integrated circuit package system 500 in an alternative embodiment of the present invention. The integrated circuit package system 500 includes a leadframe 502 having leads 504 with a leadfinger support with multi-studs 506. The leadfinger support with multi-studs 506 may be formed by an etch process applied to the leads 504. The leadfinger support with multi-studs 506 may be formed as protruding shape, such as more than one stud vertically protruding from the leads 504. The leads 504 may also include a wetting surface 508 around the leadfinger support with multi-studs 506.

The integrated circuit package system 500 also includes an integrated circuit die 510 having electrical interconnects 512. The electrical interconnects 512 may be formed on the integrated circuit die 510 and flowed on the leadfinger support with multi-studs 506 providing electrical connectivity between the integrated circuit die 510 and the leadframe 502.

The leadfinger support with multi-studs 506 provides control for a collapse level or height of the electrical interconnects 512 on the leads 504. The wetting surface 508, such as a recess, provides a physical resistance to the wetting or spread distance of the electrical interconnects 512. The control of the collapse level and the spread distance of the electrical interconnects 512 provide a substantially controlled position of the integrated circuit die 510 along both the horizontal plane and vertical axes. It has been discovered that the substantially controlled position of the integrated circuit die 510 provides for an optional die attach paddle (not shown). The substantially controlled position of the integrated circuit die 510 also provides reduced stress and improved spacing for post-connection operations such as encapsulation or cleaning.

The integrated circuit package system 500 may also include an encapsulant 514. The encapsulant 514 covers and protects the integrated circuit die 510 and the leadframe 502. An encapsulating process such as molding, bonding or sealing may be used to apply the encapsulant 514. The encapsulating process applies the encapsulant 514 over the integrated circuit die 510, the electrical interconnects 512, the leadframe 502, the leads 504, the leadfinger support with multi-studs 506 and the wetting surface 508. The encapsulant 514 may conform to the integrated circuit die 510 and the leadframe 502, although it is understood that the encapsulant may cover the integrated circuit die 510 and the leadframe 502 with other encapsulating processes.

Figure 6:
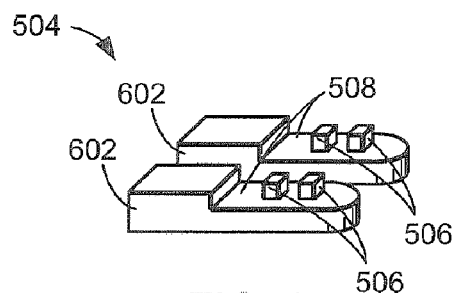
FIG. 6 is an isometric view of the leads having the leadfinger support with multi-studs.

Referring now to FIG. 6, therein is shown an isometric view of the leads 504 having the leadfinger support with multi-studs 506. The leads 504 also include the wetting surface 508 and external connections 602. The external connections 202 provide electrical connectivity to an electronic system (not shown) at a next level of integration or hierarchy such as a printed circuit board. An inner tip of the leads 504 may be etched to a reduced height while leaving portions protruding to form the leadfinger support with multi-studs 506. The reduced height of the inner tip of the leads 504 forms the wetting surface 508. It has been discovered that the leads 504 electrically connect the integrated circuit die 510 of FIG. 5 to the electronic system while providing control for the collapse level and the spread distance of the electrical interconnects 512.

The shape and size of the leadfinger support with multi-studs 506 and the wetting surface 508 of the leads 504 provide a predetermined extent for the collapse level and the spread distance. For illustrative purposes, the leadfinger support with multi-studs 506 is shown as two rectangular prisms, although it is understood that other shapes, number of shapes or sizes may be used.

Figure 7:
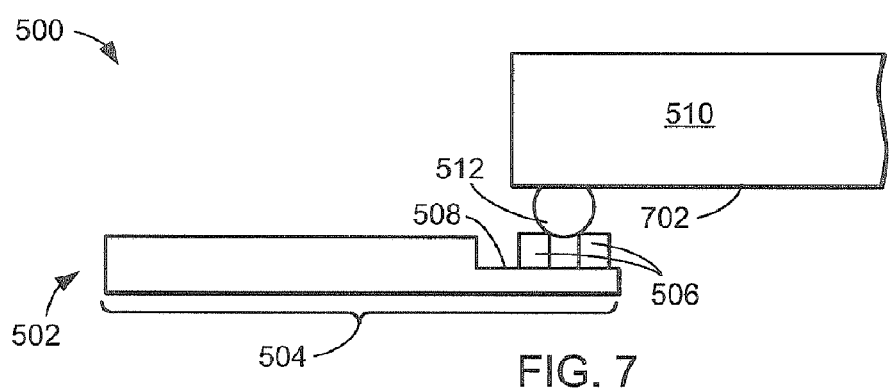
FIG. 7 is a cross-sectional view of the integrated circuit package system in a die placement phase.

Referring now to FIG. 7, therein is shown a cross-sectional view of the integrated circuit package system 500 in a die placement phase. The integrated circuit package system 500 includes the integrated circuit die 510 over the leadframe 502. The integrated circuit die 510 and the leadframe 502 are substantially fixed in a predetermined position. The electrical interconnects 512 are formed on an active surface 702 of the integrated circuit die 510. Each of the electrical interconnects 512 on the active surface 702 of the integrated circuit die 510 are substantially aligned to each of the leadfinger support with multi-studs 506 of the leadframe 502.

A fixture (not shown) may hold the integrated circuit die 510 and the leadframe 502 substantially aligned in the horizontal plane. A wetting interface material (not shown) may be applied between the electrical interconnects 512 and the leadfinger support with multi-studs 506. The wetting interface material may provide adhesion between the electrical interconnects 512 and the leadfinger support with multi-studs 506. The fixture may allow vertical movement of the integrated circuit die 510 or the leadframe 502, or the fixture may release the integrated circuit die 510 or the leadframe 502 for attachment.

Figure 8:
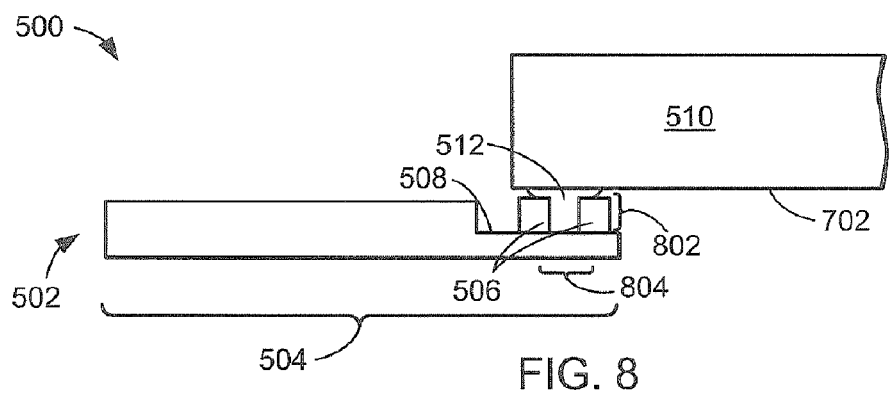
FIG. 8 is a cross-sectional view of the integrated circuit package system in a die attachment phase.

Referring now to FIG. 8, therein is shown a cross-sectional view of the integrated circuit package system 500 in a die attachment phase. The integrated circuit package system 500 includes the integrated circuit die 510 mounted over the leadframe 502. An attachment process, such as an attach reflow, provides flowing of the electrical interconnects 512 on the active surface 702 around the leadfinger support with multi-studs 506. The attachment process may include a thermal or similar process providing a liquefying or partial liquefying of the electrical interconnects 512. The electrical interconnects 512 in a liquid or partial liquid state flows around the leadfinger support with multi-studs 506 and over the wetting surface 508 of the leads 504.

The flowing of the electrical interconnects 512 results in a collapse of the electrical interconnects 512 and a position of the integrated circuit die 510 at a collapse level 802 determined by the size and shape of the leadfinger support with multi-studs 506. The flowing of the electrical interconnects 512 also results in the wetting of the electrical interconnects 512 over the wetting surface 508 to a spread distance 804 determined by the size and shape of the wetting surface 508. Each of the electrical interconnects 512 may overlap one each of the leadfinger support with multi-studs 506 and the wetting surface 508 to an extent predetermined by the size and shape of the leadfinger support with multi-studs 506 and the wetting surface 508.

Figure 9:
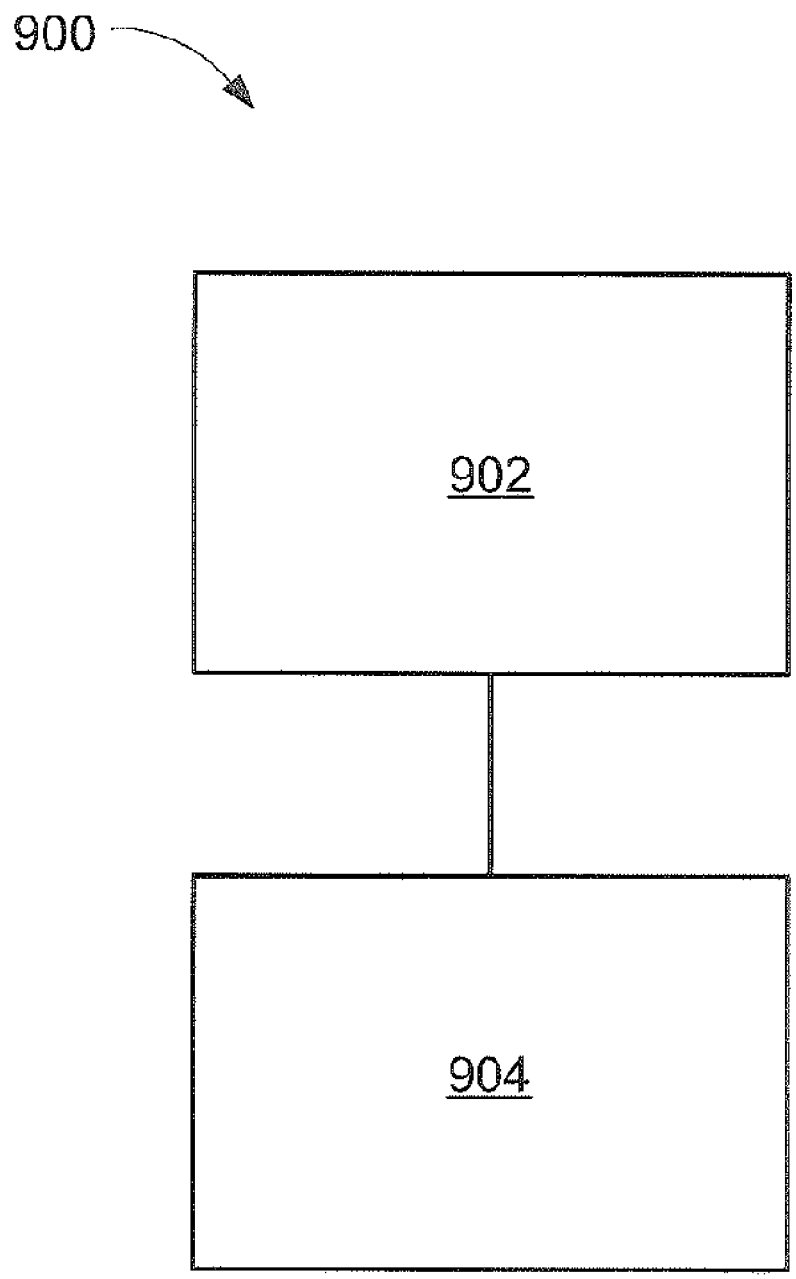
FIG. 9 is a flow chart of an integrated circuit package system for manufacturing the integrated circuit package system in an embodiment of the present invention.

Referring now to FIG. 9 is a flow chart of an integrated circuit package system 900 for manufacturing the integrated circuit package system 100 in an embodiment of the present invention. The system 900 includes forming a leadframe having a lead with a leadfinger support providing control of the collapse level in a block 902; and attaching an integrated circuit die with an electrical interconnect on the leadfinger support in a block 904.

In greater detail, a method to fabricate the integrated circuit package system 100, in an embodiment of the present invention, is performed as follows:

1. Forming the leadframe having the lead with the leadfinger support of a predetermined height providing control of the collapse height and the wetting surface providing control of the spread distance. (FIG. 1)

2. Forming an integrated circuit die with the active surface having the electrical interconnect. (FIG. 1)
3. Aligning the electrical interconnect with the leadfinger support. (FIG. 3)
4. Attaching the integrated circuit die on the leadframe at the predetermined collapse height and the spread distance. (FIG. 4)

It has been discovered that the present invention thus has numerous aspects.

An aspect is that the present invention provides controlled bump collapse. The leadfinger support provides control during wetting of the bumps. Without the leadfinger support, many factors affect the bump collapse making the resulting level or height difficult to maintain. The leadfinger support provides a predetermined level or height of the bump after wetting.

It has been discovered that the disclosed structure provides controlled bump spread. The leadfinger support provides control during wetting of the bumps. Without the leadfinger support, many factors affect the bump spread making the resulting distance or area difficult to maintain. The leadfinger support provides a resistance to the spread distance and area of the bump after wetting.

It has also been discovered that the disclosed structure eliminates the need for a die paddle. Without the leadfinger support, a die attach pad provides a substantially fixed location for the integrated circuit die. The integrated circuit die location is particularly critical for the level or height. The leadfinger support provides a predetermined level or height of the integrated circuit die after wetting.

Yet another discovery of the disclosed structure is that the manufacturing process is simplified. The bumps for the integrated circuit die may be manufactured with known technologies using efficient and economical manufacturing. The improvement to the leadframe can be implemented by adapting known technologies and is cost-effective and uncomplicated. The leadfinger support provides the required control with straightforward, efficient, and economical manufacturing.

These and other valuable aspects of the present invention consequently further the state of the technology to at least the next level.

Thus, it has been discovered that the integrated circuit package system with leadfinger support method and apparatus of the present invention furnish important and heretofore unknown and unavailable solutions, capabilities, and functional aspects. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
   forming a leadframe having a lead with a leadfinger support of a predetermined height;
   attaching an integrated circuit die with an electrical interconnect at a collapse height determined by the predetermined height of the leadfinger support and wherein attaching the integrated circuit die comprises partially liquefying and flowing the electrical interconnect around and in contact with the leadfinger support and over a wetting surface on the lead.

2. The system as claimed in claim 1 wherein forming the leadframe comprises forming the wetting surface to control the spread distance of the electrical interconnect.

3. The system as claimed in claim 1 wherein forming the leadframe comprises forming a protruding stud.

4. The system as claimed in claim 1 wherein forming the leadframe comprises forming a protruding shape.

5. An integrated circuit package system comprising:
   forming a leadframe having a lead with a leadfinger support of a predetermined height providing control of a collapse height and a wetting surface providing control of a spread distance;
   forming an integrated circuit die with an active surface having an electrical interconnect;
   aligning the electrical interconnect with the leadfinger support;
   attaching the integrated circuit die on the leadframe at the collapse height and the spread distance and wherein attaching the integrated circuit die comprises partially liquefying and flowing the electrical interconnect around and in contact with the leadfinger support and over the wetting surface.

6. The system as claimed in claim 5 wherein forming the leadframe comprises etching an inner tip of the lead with a reduced height for the wetting surface and a protruded portion for the leadfinger support.

7. The system as claimed in claim 5 wherein forming the leadframe comprises etching an inner tip of the lead having more than one protruded portion for the leadfinger support.

8. The system as claimed in claim 5 wherein aligning the electrical interconnect and the leadfinger support comprises holding the integrated circuit die along both the horizontal plane and vertical axes with a die paddle.

\* \* \* \* \*